(12) United States Patent
Lin et al.

(10) Patent No.: US 8,120,100 B2
(45) Date of Patent: Feb. 21, 2012

(54) OVERLAPPING TRENCH GATE SEMICONDUCTOR DEVICE

(75) Inventors: Wei-Chieh Lin, Hsinchu (TW); Jen-Hao Yeh, Kaohsiung County (TW); Guo-Liang Yang, Hsinchu (TW); Jia-Fu Lin, Yilan County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 310 days.

(21) Appl. No.: 12/616,770

(22) Filed: Nov. 11, 2009

(65) Prior Publication Data

US 2011/0062513 A1   Mar. 17, 2011

(30) Foreign Application Priority Data

Sep. 16, 2009 (TW) ................................. 98131204 A (51) Int. Cl.
*H01L 27/108* (2006.01)
*H01L 29/76* (2006.01)

(52) U.S. Cl. ........ 257/330; 257/331; 257/332; 257/341; 257/342; 438/259; 438/270

(58) Field of Classification Search .......... 257/330–332, 257/341–342, E21.41, E29.262; 438/259, 438/270

See application file for complete search history.

(56) References Cited

U.S. PATENT DOCUMENTS

| | | | |
|---|---|---|---|
| 5,648,283 A | 7/1997 | Tsang et al. | |
| 6,534,825 B2 * | 3/2003 | Calafut | 257/335 |
| 6,690,062 B2 | 2/2004 | Henninger et al. | |
| 6,710,403 B2 * | 3/2004 | Sapp | 257/330 |
| 7,372,103 B2 | 5/2008 | Zundel et al. | |
| 7,375,029 B2 | 5/2008 | Poelzl | |
| 7,400,014 B2 | 7/2008 | Thapar | |
| 7,414,286 B2 | 8/2008 | Hirler et al. | |
| 7,446,374 B2 | 11/2008 | Thorup et al. | |
| 7,453,119 B2 | 11/2008 | Bhalla et al. | |
| 7,473,603 B2 | 1/2009 | Kraft et al. | |
| 7,476,589 B2 | 1/2009 | Grebs et al. | |
| 7,501,323 B2 | 3/2009 | Zeng | |
| 7,504,303 B2 | 3/2009 | Yilmaz et al. | |

\* cited by examiner

*Primary Examiner* — Theresa T Doan
(74) *Attorney, Agent, or Firm* — Winston Hsu; Scott Margo (57) ABSTRACT

An overlapping trench gate semiconductor device includes a semiconductor substrate, a plurality of shallow trenches disposed on the semiconductor substrate, a first conductive layer disposed in the shallow trenches, a plurality of deep trenches respectively disposed in each shallow trench, a second conductive layer disposed in the deep trenches, a source metal layer and a gate metal layer. Each of the deep trenches extends into the semiconductor substrate under each shallow trench. The source metal layer is electrically connected to the second conductive layer, and the gate metal layer is electrically connected to the first conductive layer.

8 Claims, 11 Drawing Sheets

OVERLAPPING TRENCH GATE SEMICONDUCTOR DEVICE

BACKGROUND OF THE INVENTION

1. Field of the Invention

The present invention relates to an overlapping trench gate semiconductor device and its manufacturing method, and more particularly to an overlapping trench gate semiconductor device having a lower parasitic capacitance between a gate electrode and a drain electrode and its manufacturing method.

2. Description of the Prior Art

A trench gate semiconductor device is primarily used in power management such as switching power supplies, power control ICs of computer systems or peripherals, power supplies of backlight, motor controllers, etc.

Figure 1:
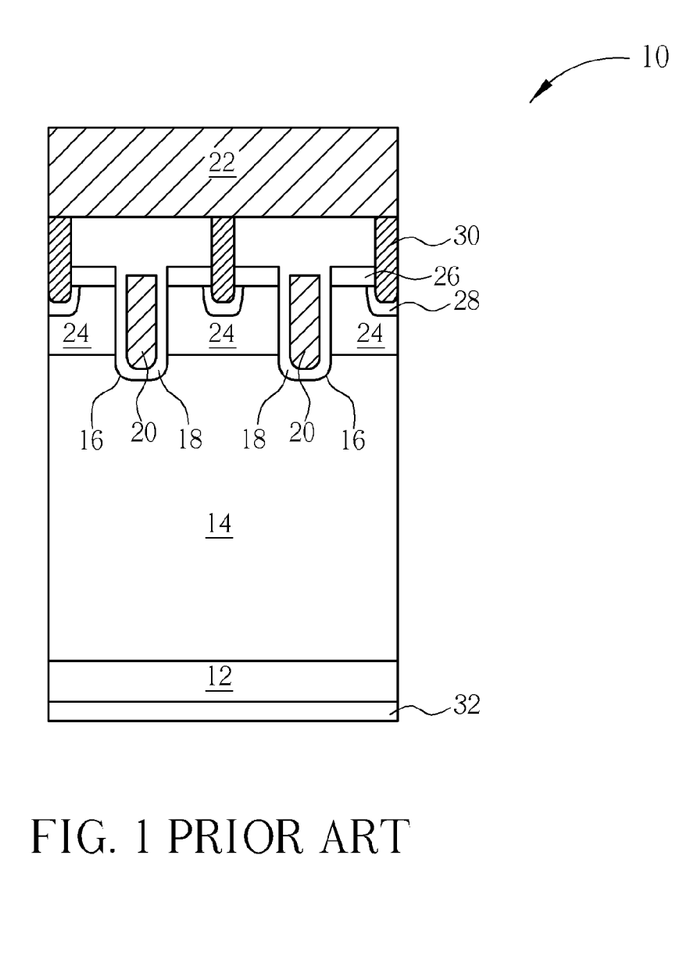
FIG. 1 is a schematic diagram of a cross-sectional view of a prior art trench gate semiconductor device.

Please refer to FIG. 1. FIG. 1 is a schematic diagram of a cross-sectional view of a prior art trench gate semiconductor device. As illustrated in FIG. 1, the prior art trench gate semiconductor device 10 includes an N type substrate 12, an N type epitaxial layer 14, a plurality of trenches 16, a gate insulation layer 18, a plurality of gate electrodes 20, and a source metal layer 22. The N type epitaxial layer 14 is disposed on the N type substrate 12 and each of the trenches 16 is disposed on the N type epitaxial layer 14. The gate insulation layer 18 is disposed on surfaces of the trenches 16, and each of the gate electrodes 20 fill each of the trenches 16. Also, the gate insulation layer 18 electrically insulates the gate electrodes 20 from the source metal layer 22. A plurality of P type doped base regions 24 are formed on the N type epitaxial layer 14 and an N type doped source region 26 is formed on each P type doped base region 24. Furthermore, a P type heavily doped region 28 is disposed in each P type doped base region 24. Each P type heavily doped region 28 is electrically connected to the source metal layer 22 through a contact plug 30. Moreover, a drain metal layer 32 of the prior art trench gate semiconductor device 10 is disposed on a bottom surface of the N type substrate 12.

Although the trench gate semiconductor device can provide a rapid switching rate of a power source, a spike effect would occur during the switching of the power source. In order to avoid the spike effect, a ratio (Ciss/Crss) between an input capacitance (Ciss) and a reverse transfer capacitance (Crss) is often increased to reduce the spike effect during the switching.

The prior art trench gate semiconductor device raises the Ciss/Crss ratio by forming a shielding electrode structure under the gate electrode structure, thereby reducing the parasitic capacitance (also known as the Crss) between the gate electrode and the drain electrode through the shielding electrode structure. Also, a typical Ciss is composed of the parasitic capacitance between the gate electrode and the source electrode and the parasitic capacitance between the gate electrode and the drain electrode; therefore, without changing the parasitic capacitance between the gate electrode and the source electrode, lowering the parasitic capacitance between the gate electrode and the drain electrode of the device could increase the Ciss/Crss ratio, which reduces the spike effect.

Since the shielding electrode structure is located under the gate electrode structure and both the shielding electrode structure and the gate electrode structure are in a same trench, forming the shielding electrode structure and the gate electrode structure requires numerous steps of deposition processes and etching processes which is not only time consuming, but also increases costs in processes. Therefore, methods of raising the Ciss/Crss ratio and reducing any additional manufacturing cost have become objectives in the industry.

SUMMARY OF THE INVENTION

It is therefore an objective of the present invention to provide an overlapping trench gate semiconductor device which raises the Ciss/Crss ratio.

According to an embodiment of the present invention, an overlapping trench gate semiconductor device is provided, including: a semiconductor substrate comprising a top surface and a bottom surface, a plurality of shallow trenches disposed on the top surface of the semiconductor substrate, a first conductive layer disposed on the shallow trenches, a first insulation layer disposed on surfaces of the shallow trenches, a plurality of deep trenches, a second conductive layer filling the deep trenches, a second insulation layer disposed on the top surface of the semiconductor substrate and on surfaces of the deep trenches, a source metal layer disposed above the first conductive layer, a gate metal layer disposed on the top surface of the semiconductor substrate, and a drain metal layer disposed on the bottom surface of the semiconductor substrate. The semiconductor substrate has a first conductive type. The first insulation layer electrically insulates the first conductive layer from the semiconductor substrate. The deep trenches are respectively disposed in each of the shallow trenches and extending into the semiconductor substrate under each of the shallow trenches. The second insulation layer electrically insulates the second conductive layer from the semiconductor substrate and the first conductive layer. The drain metal layer electrically connects the second conductive layer and the gate metal layer electrically connects the first conductive layer.

The present invention provides a method of manufacturing an overlapping trench gate semiconductor device, including: providing a semiconductor substrate including a top surface and a bottom surface disposed opposite to each other wherein the top surface of the semiconductor substrate includes a plurality of shallow trenches, wherein surfaces of the shallow trenches are covered with a first insulation layer, and the shallow trenches are filled with a first conductive layer; removing a part of the first conductive layer and a part of the first insulation layer in each of the shallow trenches and a part of the semiconductor substrate under the removed first insulation layer, thereby forming a plurality of deep trenches, wherein each of the deep trenches is located between parts of the first conductive layer in each of the shallow trenches; forming a second insulation layer on the top surface of the semiconductor substrate and on surfaces of the deep trenches; filling the deep trenches with a second conductive layer; forming a plurality of first source contact plugs between any two adjacent shallow trenches, penetrating the first insulation layer and the second insulation layer; forming a source metal layer on the top surface of the semiconductor substrate, wherein the source metal layer is electrically connected to the second conductive layer and the first source contact plugs.

The overlapping trench gate semiconductor device of the present invention forms deep trenches in the shallow trenches. The second conductive layer filled in the deep trenches generates an electric field which extends the depletion region between each of the doped base regions and the epitaxial layer to the epitaxial layer. The depth of the depletion region in the epitaxial layer is at a same depth as the deep trenches such that the Crss between the first conductive layer acting as the gate electrode and the drain metal layer is lowered, raising the overall Ciss/Crss ratio and reducing the Miller effect.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
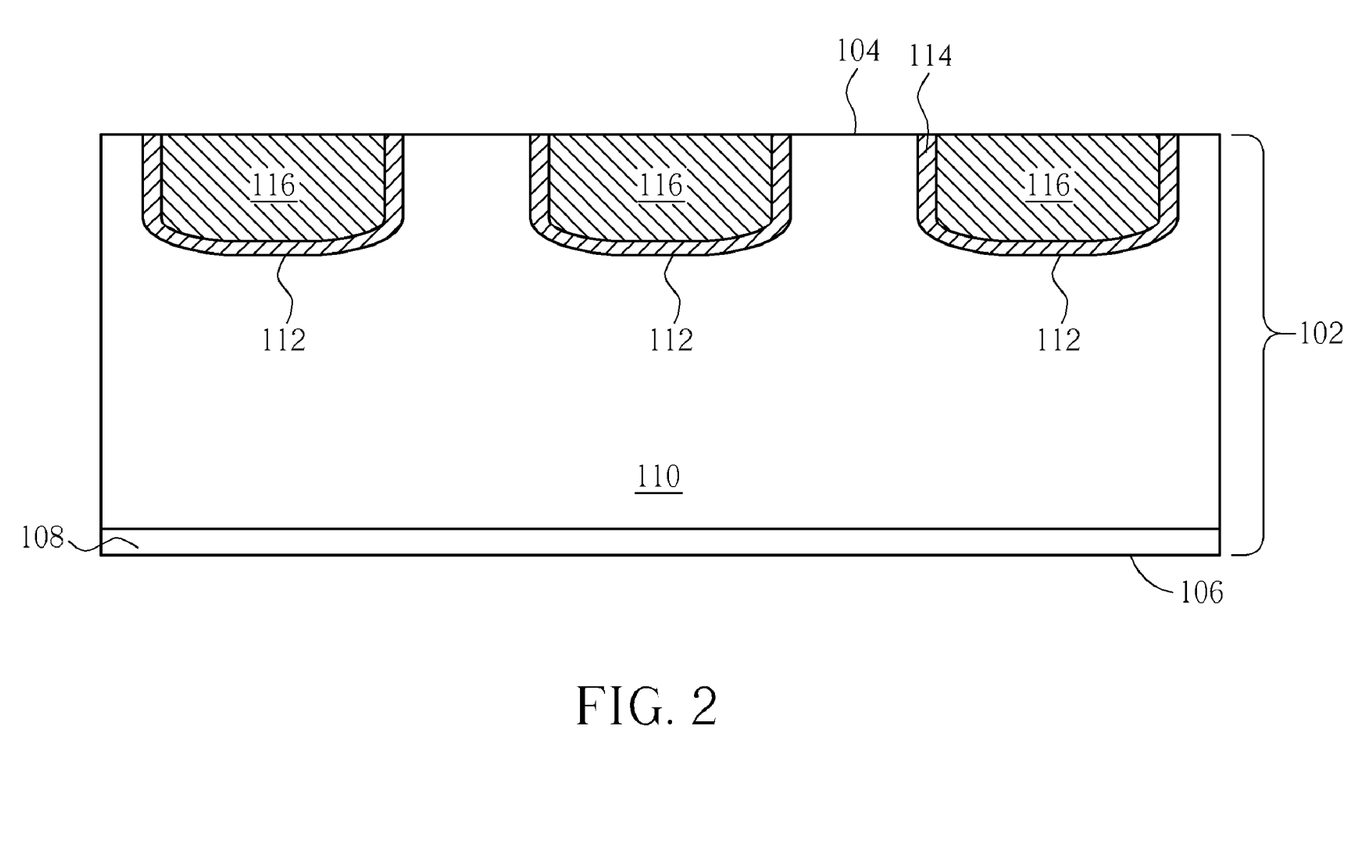
FIG. 2 through FIG. 8 are schematic diagrams illustrating a method of manufacturing an overlapping trench gate semiconductor according to a first embodiment of the present invention.

Please refer to FIG. 2 through FIG. 8. FIG. 2 through FIG. 8 are schematic diagrams of a method of manufacturing an overlapping trench gate semiconductor according to a first embodiment of the present invention. As illustrated in FIG. 2, a semiconductor substrate 102 is first provided; the semiconductor substrate 102 includes a top surface 104 and a bottom surface 106 disposed opposite to each other; the semiconductor substrate 102 is composed of a substrate 108 and an epitaxial layer 110 formed above the substrate 108. The semiconductor substrate 102 has the first conductive type such as an N type or a P type. The semiconductor substrate 102 of the present embodiment is an N type, but the present invention is not limited to this. The substrate 108 may be a silicon based substrate and both the substrate 108 and the epitaxial layer 110 are the first conductive type. When the overlapping trench gate semiconductor device is used as a power device, the epitaxial layer 110 is a lightly doped region. If higher voltage endurance is required, thickness of the epitaxial layer 110 should be increased. Furthermore, the substrate 108 is a heavily doped region and a dopant concentration of the substrate 108 is higher than a dopant concentration of the epitaxial layer 110.

Then, a photolithography process with a first photo mask is performed to form a first mask pattern (not illustrated) on the top surface 104 of the semiconductor substrate 102 which defines the position of each of the shallow trenches 112. An etching process forms a plurality of shallow trenches 112 on the top surface 104 of the semiconductor substrate 102 followed by removing the first mask pattern; then a chemical vapor deposition process forms a first insulation layer 114 on the top surface 104 of the semiconductor substrate 102 and on surfaces of the shallow trenches 112; a planarization process removes the first insulation layer 114 outside the shallow trenches 112; a deposition process forms a first conductive layer 116 in the shallow trenches 112 and fills all of the shallow trenches 112; and another planarization process is further performed to form a plurality of shallow trench structures. The first insulation layer 114 electrically insulates the first conductive layer 116 from the semiconductor substrate 102, and the first conductive layer 116 can be regarded as a gate electrode of the overlapping trench gate semiconductor device. Furthermore, the first conductive layer 116 can be a doped semiconductor layer. For example, the first conductive layer 116 can be a doped polysilicon layer, but is not limited to this. The present embodiment can also perform the planarization process after a continuous formation of the first insulation layer 114 and the first conductive layer 116.

Figure 3:
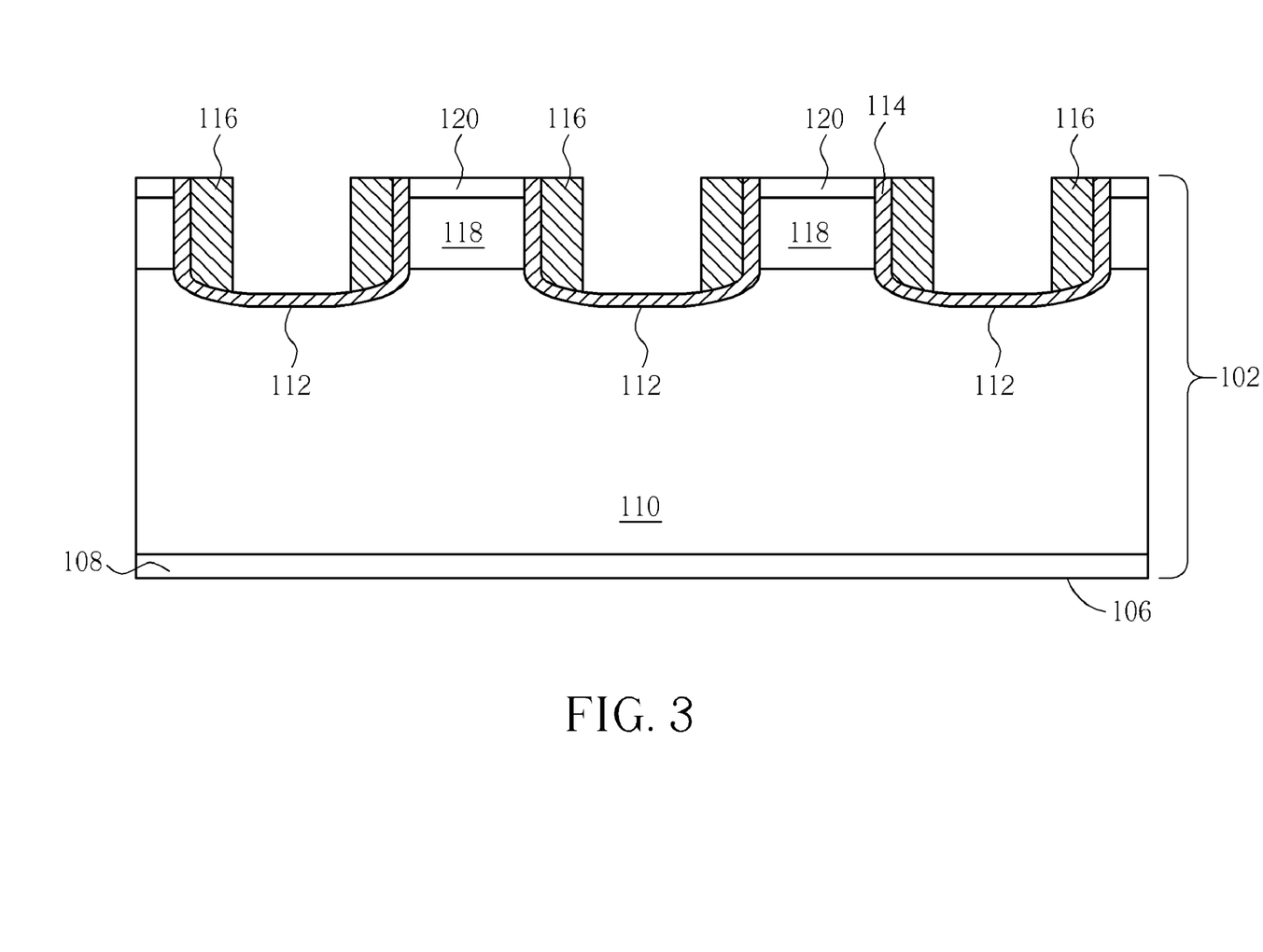

As illustrated in FIG. 3, a photolithography process with a second photo mask forms a second mask pattern (not illustrated) such as a photo resist pattern. Then, an ion implantation process having a second conductive type is performed which implants ions of the second conductive type into the semiconductor substrate 102 between any two adjacent shallow trenches 112. The second conductive type of the present embodiment is a P type, but is not limited to this; the first conductive type and the second conductive type are interchangeable. After removing the second mask pattern, a drive-in process diffuses the ions of the second conductive type to a depth equivalent to bottoms of the shallow trenches 112, so as to form a plurality of doped base regions 118 having the second conductive type between any two adjacent shallow trenches 112. A photolithography process with the second photo mask forms a third mask pattern (not illustrated). Then an ion implantation process having the first conductive type is performed which implants ions of the first conductive type into top surfaces of the doped base regions 118. After removing the third mask pattern, a drive-in process diffuses ions of the first conductive type in the doped base regions 118, forming a plurality of doped source regions 120 respectively on each of the corresponding doped base regions 118. A dopant concentration of the doped source regions 120 is higher than a dopant concentration of the epitaxial layer 110. Furthermore, each of the doped base regions 118 near the first insulation layer 114 is regarded as a channel of the overlapping trench gate semiconductor device, and each of the doped source regions 120 is regarded as a source electrode of the overlapping trench gate semiconductor device. In addition, the second mask pattern and the third mask pattern of the present embodiment can be a same mask pattern, for example an oxide layer.

Figure 4:
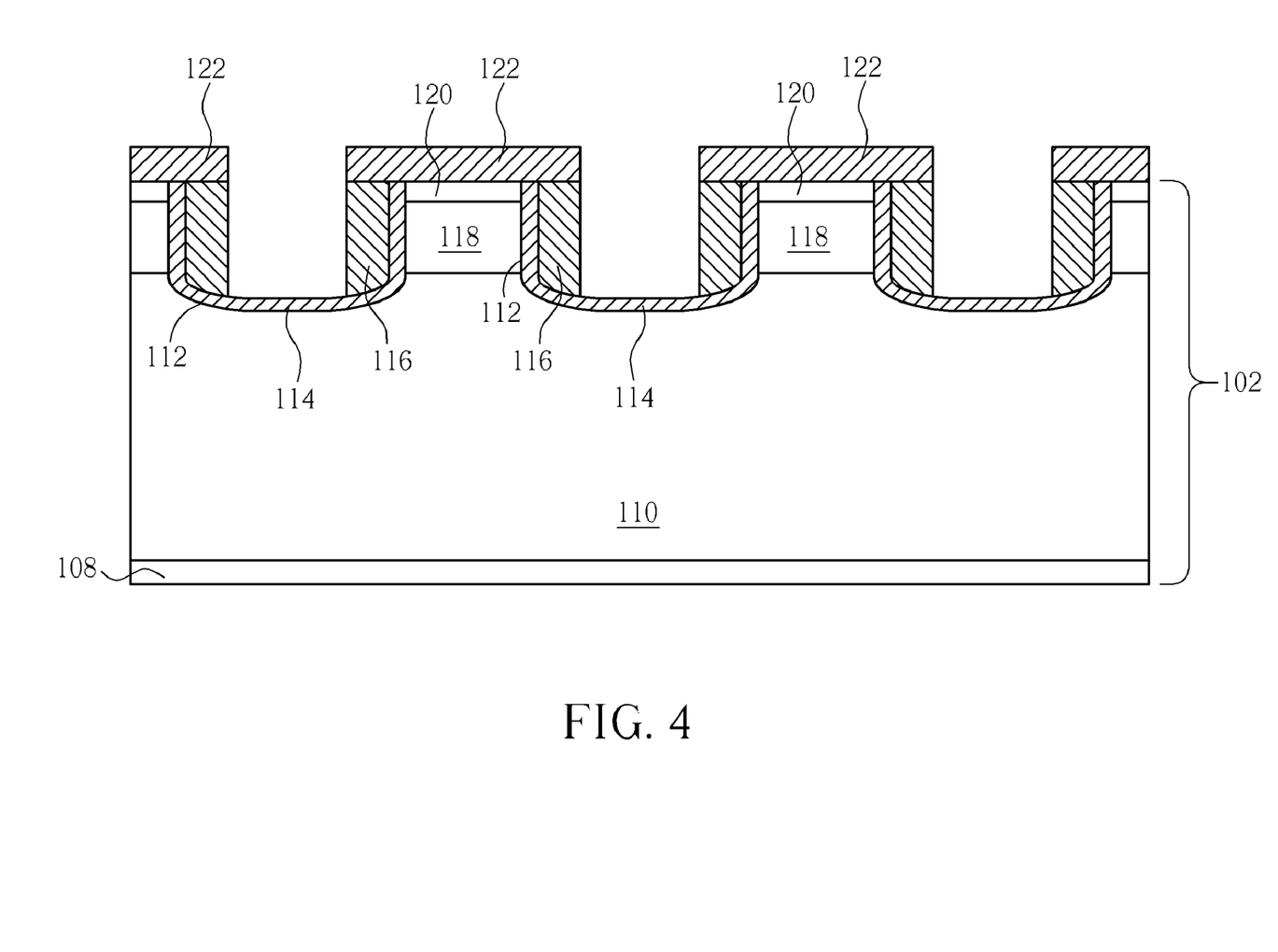

As illustrated in FIG. 4, a deposition process deposits a third insulation layer 122 covering the top surface 104 of the semiconductor substrate 102. A photolithography process with a third photo mask then forms a fourth mask pattern (not illustrated) which defines positions of a plurality of deep trenches, and removes parts of the third insulation layer 122 and a part of the first conductive layer 116 in each of the shallow trenches 112, exposing parts of the first insulation layer 114. Each of the deep trenches is respectively disposed between parts of the first conductive layer 116 in each of the shallow trenches. Furthermore, the step for removing a part of the first conductive layer 116 in each of the shallow trenches 112 is not limited to using the third mask pattern as a mask; the third insulation layer 122 can also be used to define the position of the deep trenches and expose parts of the first conductive layer 116. Next, the third insulation layer 122 is used as a mask, and the exposed first conductive layer 116 is removed. To avoid removal of the first conductive layer 116 under the third insulation layer 122, a preferable step of removing the first conductive layer 116 is performed by using an anisotropic etching process, e.g. a dry etching process.

Figure 5:
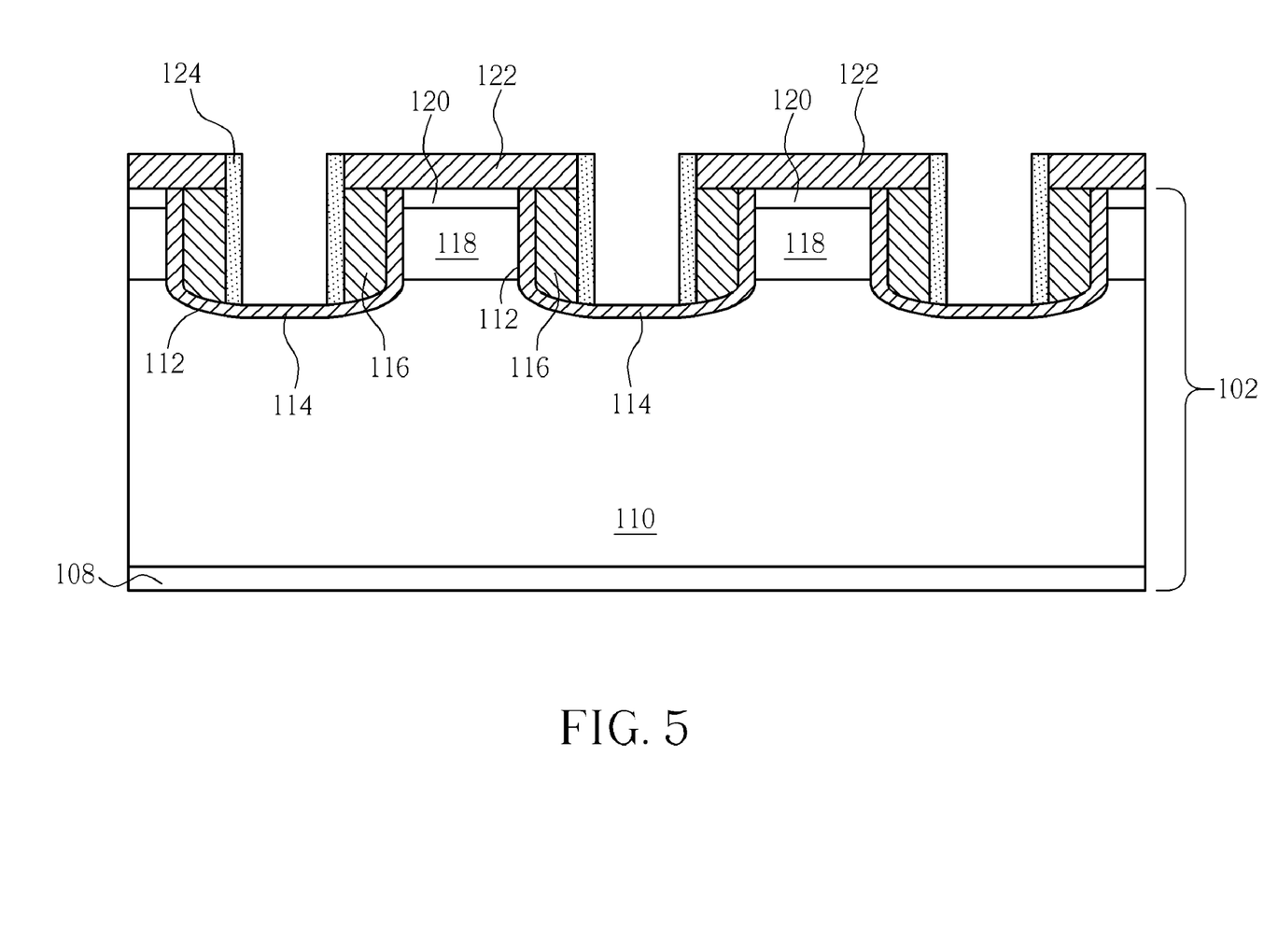

As illustrated in FIG. 5, a deposition process deposits a nitride layer 124 on the top surface 104 of the semiconductor substrate 102. The nitride layer 124 includes an insulating material for an etch stop layer such as silicon nitride, but is not limited to this. Then, an etching process removes the nitride layer 124 on the third insulation layer 122 and the nitride layer 124 on the bottom of each of the shallow trenches 112. A protecting spacer 125 is formed on each side wall of the first conductive layer 116, and a part of the first insulating layer 114 on the bottom of each of the shallow trenches 112 are exposed. It should be noted that the protecting spacers 125 are used to protect the side walls of the first conductive layer 116 in each of the shallow trenches 112 so as to avoid damage of the first conductive layer 116 resulting from the first conductive layer 116 in each of the shallow trenches 112 being etched in following etching processes.

Figure 6:
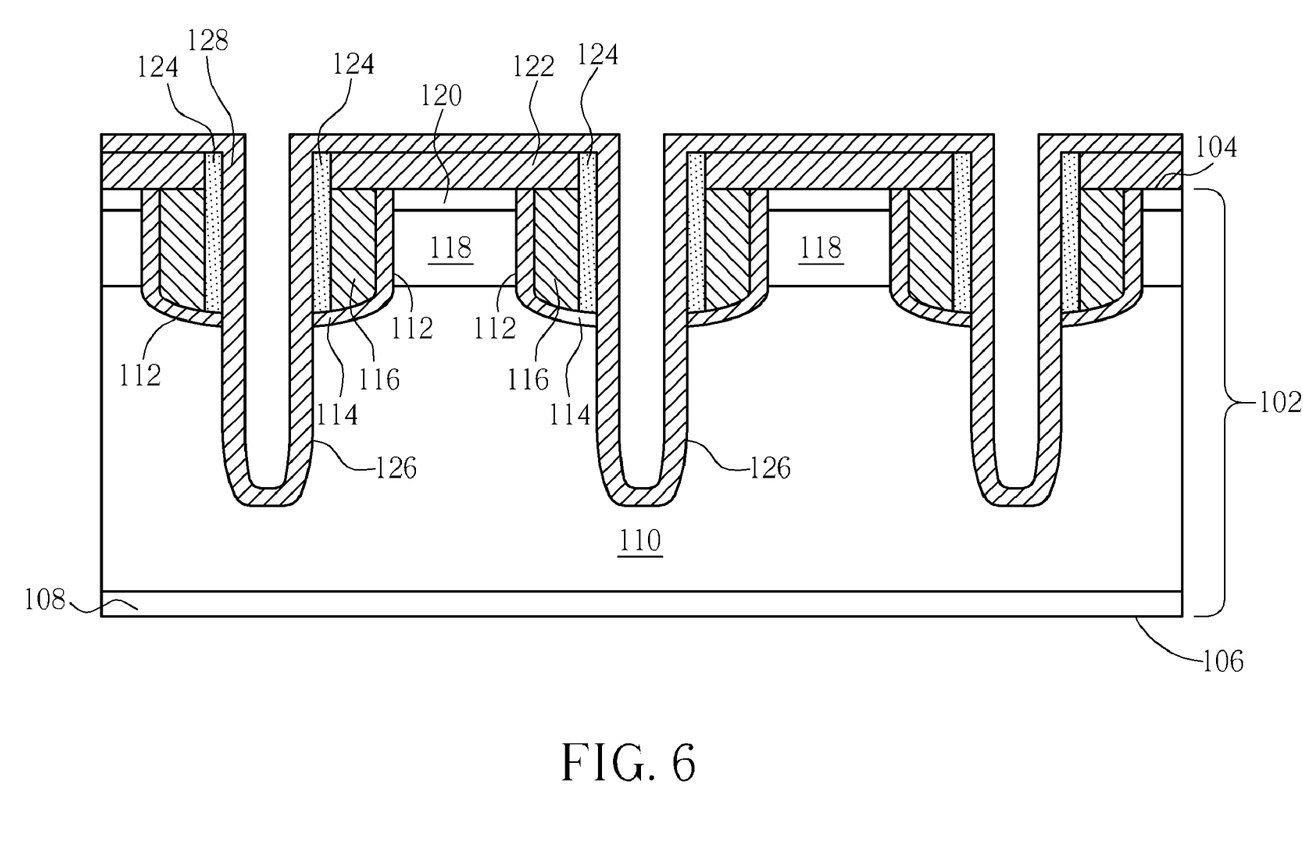
Figure 7:
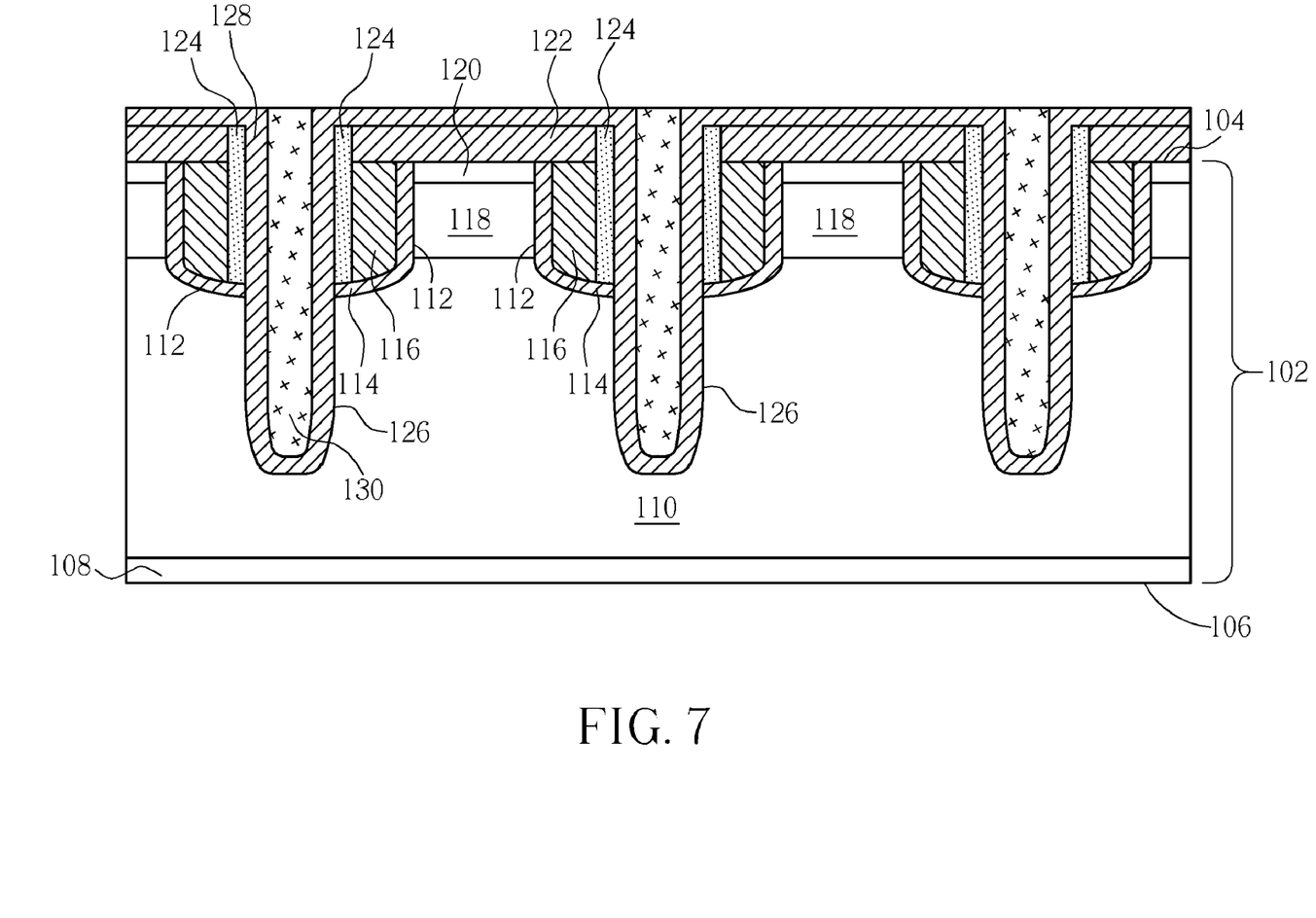

As illustrated in FIG. 6, an etching process removes parts of the exposed first insulation layer 114 and parts of the semiconductor substrate 102 under the exposed first insulation layer 114 so as to form a plurality of deep trenches 126. The deep trenches 126 are respectively disposed in each of the shallow trenches 112, and each of the deep trenches 126 penetrates the first conductive layer 116 and the first insulation layer 114 from the top surface 104 of the semiconductor substrate 102, extending into the semiconductor substrate 102 under each of the shallow trenches 112. Then a second insulation layer 128 covers a top of the semiconductor substrate 102 and surfaces of the deep trenches 126. Next, as illustrated in FIG. 7, a deposition process forms a second conductive layer 130 on the second insulation layer 128, and the second conductive layer 130 fills each of the deep trenches 126. After the deposition process, an etching-back process etches the second conductive layer 130 outside the deep trenches 126 so as to form a plurality of deep trench structures, wherein a part of the second conductive layer 130 in each of the deep trenches 126 is disposed below each of the shallow trenches 112. The second insulation layer 128 electrically insulates the second conductive layer 130 from the semiconductor substrate 102 and the first conductive layer 116. Since the second insulation layer 128 covers above the first conductive layer 116, it also electrically insulates the first conductive layer 116 from a later deposited source metal layer. Also, the second conductive layer 130 can be a doped semiconductor layer, but is not limited to this.

Figure 8:
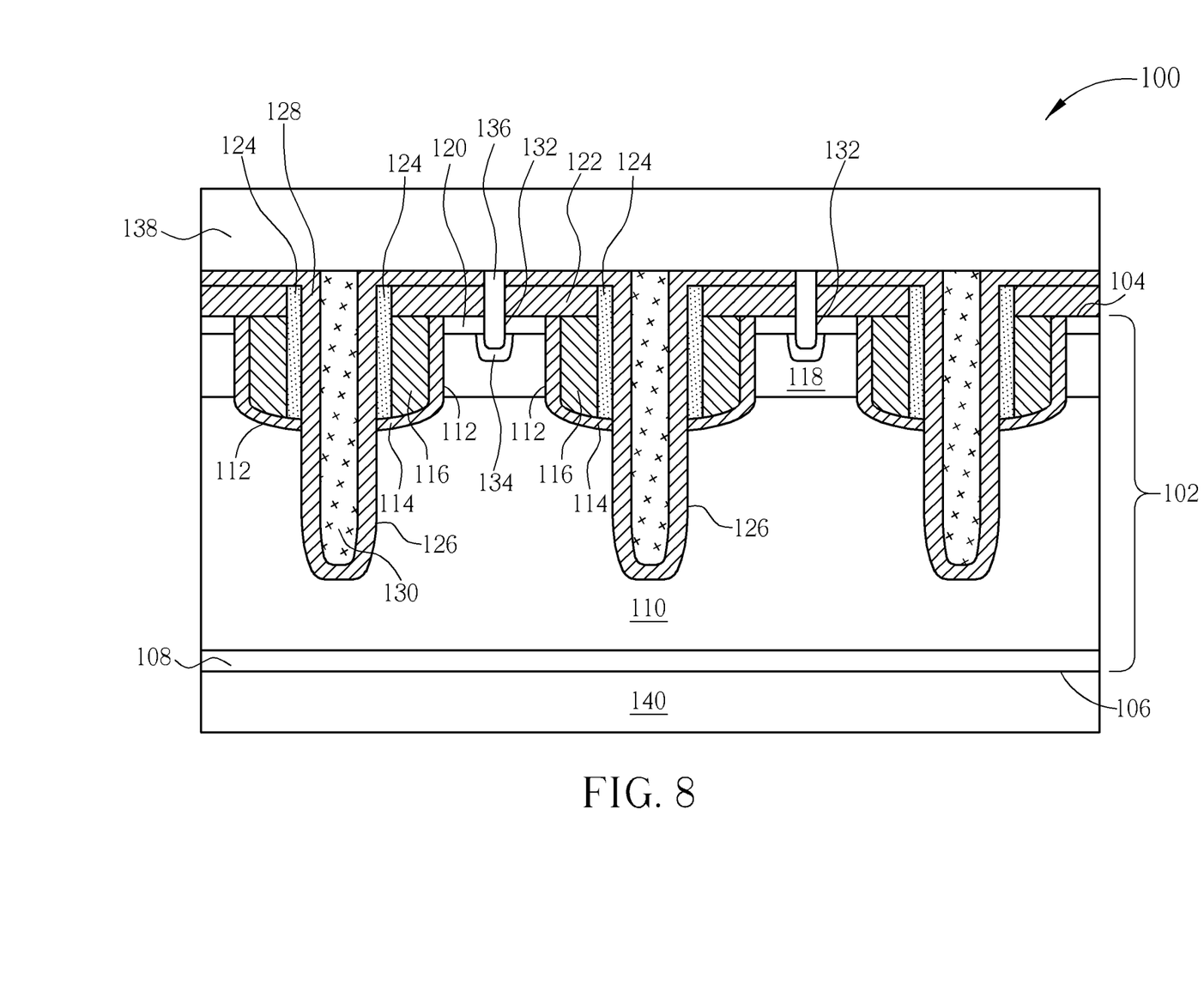

As illustrated in FIG. 8, a photolithography process with a fourth photo mask forms a fifth mask pattern (not illustrated), defining positions of a plurality of source contact holes 132. An etching process forms each of the source contact holes 132 between any two adjacent shallow trenches 112, exposing each of the doped base regions 118 wherein each of the source contact holes 132 penetrates the second insulation layer 128, the third insulation layer 122, and each of the doped source regions 120. Then an ion implantation process having the second conductive type is performed, forming a doped source contact region 134 having the second conductive type on surface of each of the exposed doped base regions 118, wherein a dopant concentration of each of the doped source contact regions 134 is higher than a dopant concentration of the doped base regions 118, lowering the resistance between the doped source regions 120 and the first source contact plugs 136. Next, a deposition process and an etching-back process are performed in sequence, forming the first source contact plugs 136 in each of the source contact holes 132, wherein each of the first source contact plugs 136 is respectively disposed in each of the doped source regions 120, penetrating the second insulation layer 128 and the third insulation layer 122. Each of the doped source contact regions 134 is respectively disposed between each of the first source contact plugs 136 and each of the doped base regions 118. Note that in order to achieve a smaller size of the overlapping trench gate semiconductor device, it is preferred to have the first source contact plugs 136 formed by a tungsten-plug process.

Next, a gate metal layer (not illustrated in FIG. 8) and a source metal layer 138 are formed on the top surface 104 of the semiconductor substrate 102. Also, a drain metal layer 140 is formed on the bottom surface 106 of the semiconductor substrate 102. The source metal layer 138 directly covers the deep trench structures and the shallow trench structures such that the second conductive layer 130 and each of the first source contact plugs 136 are directly connected as well as electrically connected with the source metal layer 138. Also, the first source contact plugs 136 are electrically connected to each of the doped source regions 120 and the source metal layer 138. The overlapping trench gate semiconductor device 100 of the first embodiment is now completed.

Figure 9:
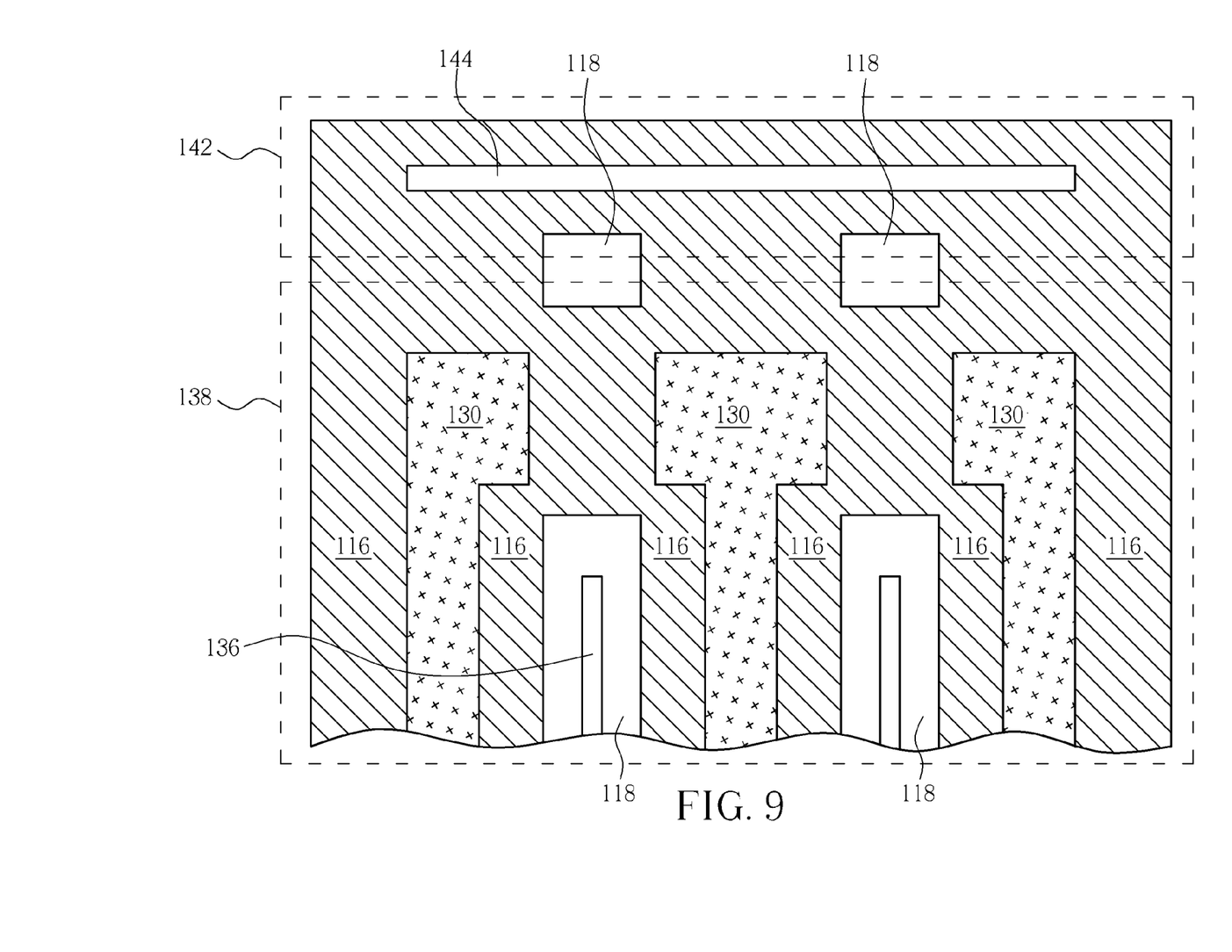
FIG. 9 is a schematic diagram of a top view of the overlapping trench gate semiconductor device according to the first embodiment of the present invention.

Please refer to FIG. 9. FIG. 9 is a schematic diagram of a top view of the overlapping trench gate semiconductor device of the first embodiment. As illustrated in FIG. 9, a gate metal layer 142 is formed on a side of the source metal layer 138, and the gate metal layer 142 is electrically insulated from the source metal layer 138 and overlapped with parts of the first conductive layer 116. Furthermore, during the formation of the first source contact plugs 136, the manufacturing method of the overlapping trench gate semiconductor device of the present embodiment further includes forming a gate contact plug 144 on the first conductive layer 116 such that the gate contact plug 144 is disposed between the first conductive layer 116 and the gate metal layer 142, and the gate contact plug 144 electrically connects the first conductive layer 116 with the gate metal layer 142.

Note that during operations of the prior art overlapping trench gate semiconductor device, the depletion region between each of the doped base regions and the epitaxial layer is located in the epitaxial layer at a depth equivalent to the bottom of the shallow trenches. However, at the beginning of operation of the overlapping trench gate semiconductor device, the first conductive layer is provided with a gate signal and the second conductive layer is provided with a source signal; the depletion region between each of the doped base regions and the epitaxial layer is extended to the epitaxial layer at a depth equivalent to the bottom of the deep trenches by an electric field generated by the second conductive layer disposed at the two sides of the depletion region. Thereby, the parasitic capacitance between the first conductive layer (acting as a gate electrode) and the drain metal layer (acting as a drain electrode) is reduced due to the extension of the depletion region which effectively lowers the reverse transfer capacitance Crss of the overlapping trench gate semiconductor device. Through controlling the parasitic capacitance between the source electrode and the gate electrode, this effectively raises the Ciss/Crss ratio, which reduces the spike effect generated by the Miller effect. Also, the Ciss is composed of the capacitance between the source electrode and the gate electrode and the capacitance between the drain electrode and gate electrode.

Furthermore, the third insulation layer of the present embodiment controls the parasitic capacitance between the source metal layer and the first conductive layer, which further controls the capacitance between the source electrode and the gate electrode. The protecting spacers of the present embodiment are disposed in a perpendicular direction between the first conductive layer and the second conductive layer, thereby adjusting the thicknesses of the protecting spacers adjusts the parasitic capacitance between the first conductive layer and the second conductive layer which further controls the capacitance between the source electrode and the gate electrode. Therefore, the overlapping trench gate semiconductor device of the present embodiment can effectively raise the Ciss/Crss by fixing the capacitance between the source electrode and the gate electrode according to the third insulation layer and the protecting spacer combined with lowering the Crss. For example, the Ciss/Crss ratio of the prior art overlapping trench gate semiconductor device is approximately 10 and the Ciss/Crss ratio of the overlapping trench gate semiconductor device of the present embodiment is increased to approximately 30.

In addition, note that in order to increase the Ciss/Crss ratio by reducing the Crss, the prior art device uses a method of forming a shielding electrode structure under the gate electrode structure which requires several processes for forming mask patterns to form the gate electrode structure. However, in comparison to the prior art overlapping trench gate semiconductor device, the present invention achieves the same effect through forming the deep trench structures in the shallow trenches, and only one additional photo mask is required for the manufacturing process of the overlapping trench gate semiconductor device of the present invention which effectively reduces the manufacturing costs and saves process steps.

Figure 10:
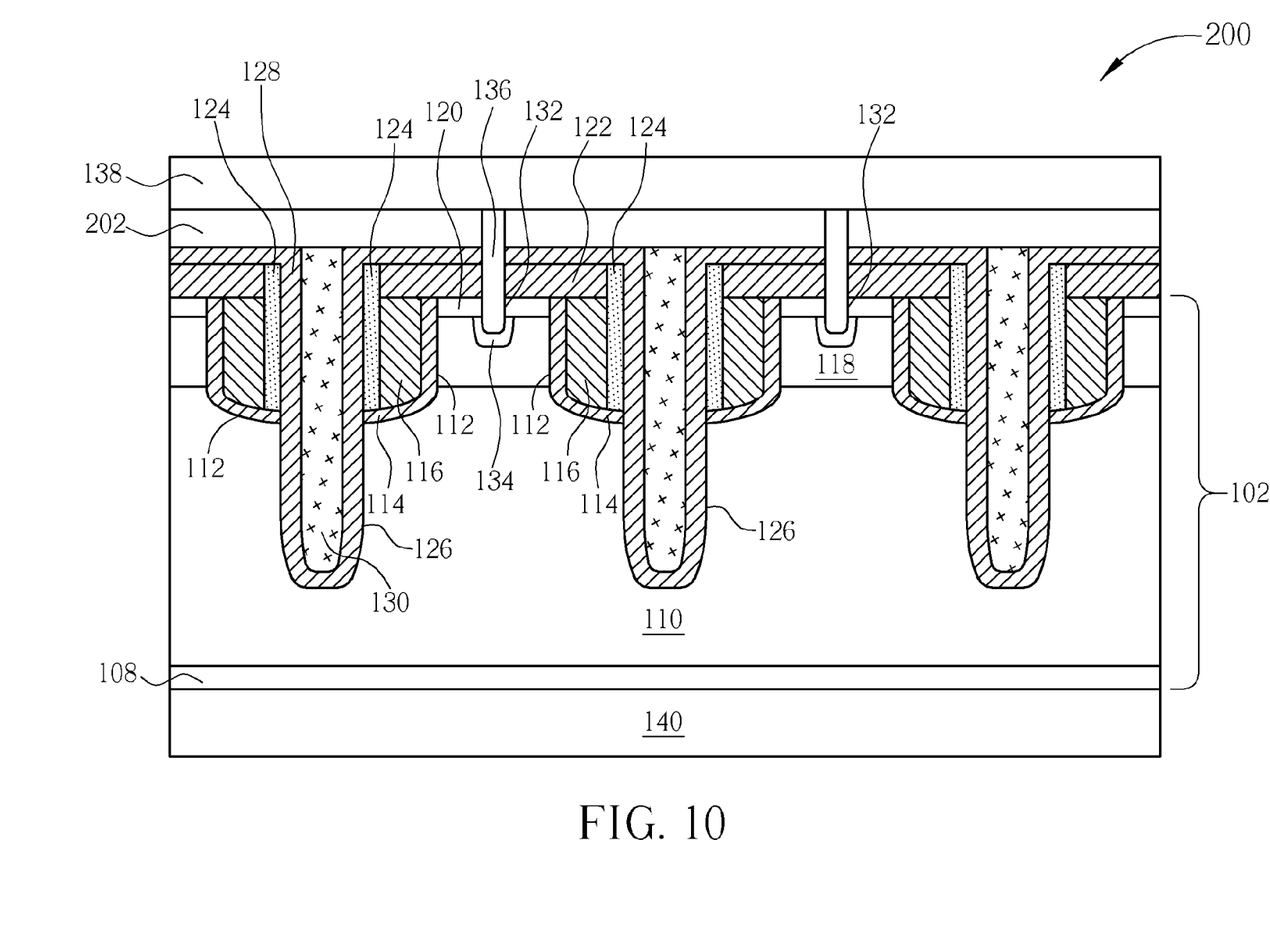
FIG. 10 is a schematic diagram of the manufacturing method of the overlapping trench gate semiconductor device according to a second embodiment of the present invention.

Please refer to FIG. 10. FIG. 10 is a schematic diagram of the manufacturing method of the overlapping trench gate semiconductor device of a second embodiment. In order to compare the differences between the first embodiment and the second embodiment, like elements are denoted by like numerals, and are not detailed redundantly. As illustrated in FIG. 10, in comparison with the first embodiment, the method of manufacturing the overlapping trench gate semiconductor device 200 of the present embodiment further includes covering the second insulation layer 128 and the second conductive layer 130 with a fourth insulation layer 202 between the step of forming the deep trenches and the step of forming the first source contact plugs. The fourth insulation layer 202 is disposed between the second conductive layer 130 and the source metal layer 138. In addition, the first source contact plugs 136 formed after the step of forming the fourth insulation layer 202 penetrates the fourth insulation layer 202.

Figure 11:
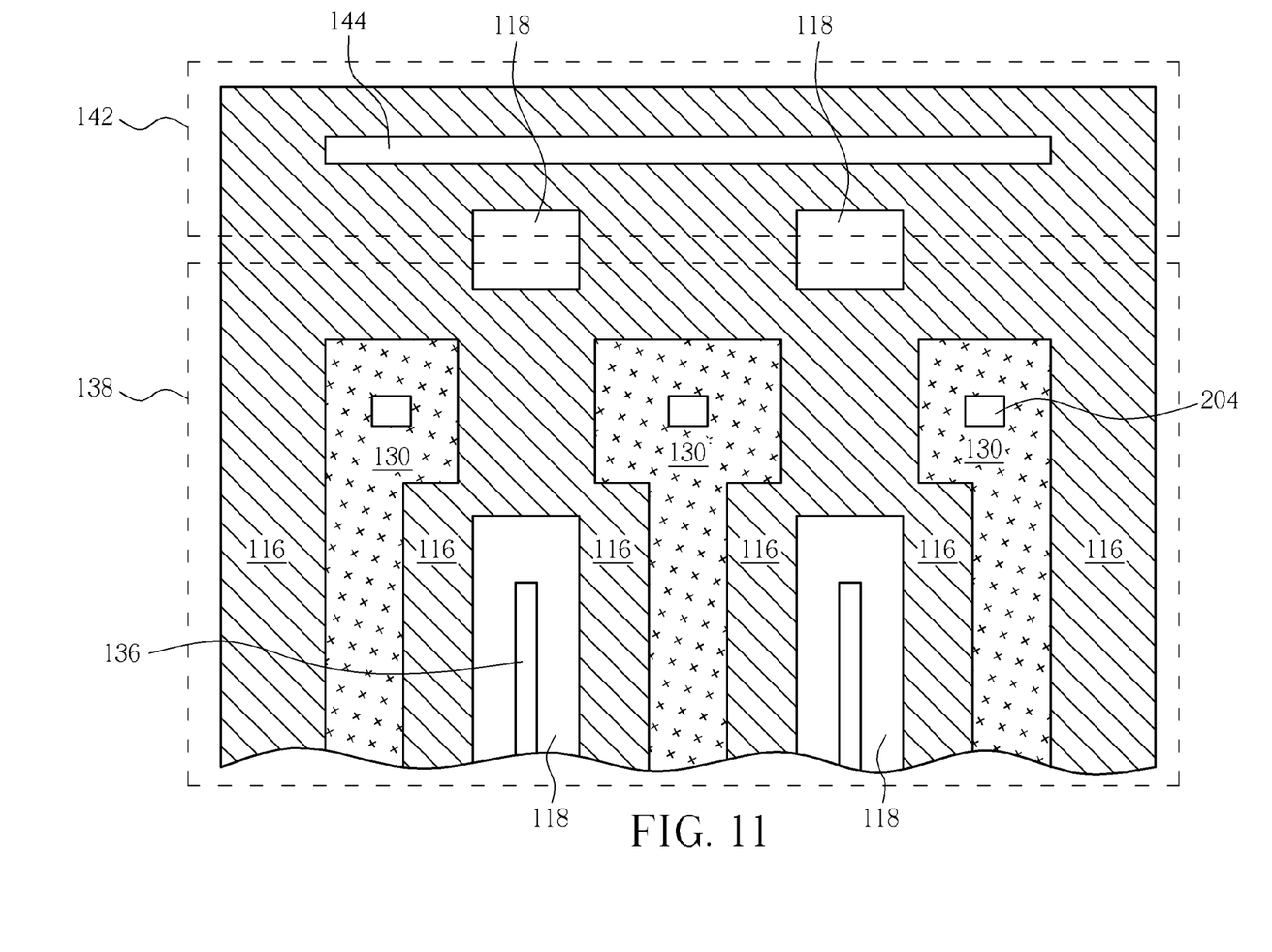
FIG. 11 is a schematic diagram of a top view of the overlapping trench gate semiconductor device according to the second embodiment of the present invention.

Please refer to FIG. 11. FIG. 11 is a schematic diagram of a top view of the overlapping trench gate semiconductor device of the second embodiment of the present invention. As illustrated in FIG. 11, the method of manufacturing the overlapping trench gate semiconductor device 200 of the present embodiment also forms a plurality of second source contact plugs 204 on the second conductive layer 130 during the step of forming the first source contact plugs 136. The second source contact plugs 204 penetrate the fourth insulation layer 202 and connect with the source metal layer 138 and the second conductive layer 130.

In summary, the overlapping trench gate semiconductor device of the present invention forms the deep trenches in the shallow trenches such that the second conductive layer which fills the deep trenches generates an electric field, and the electric field extends the depletion region between each of the doped base regions and the epitaxial layer to a depth in the epitaxial layer the same as the depth of the deep trenches in the epitaxial layer. Thereby, the Crss between the first conductive layer acting as the gate electrode and the drain metal layer is lowered, and the overall Ciss/Crss ratio is increased so as to reduce the Miller effect.

Those skilled in the art will readily observe that numerous modifications and alterations of the device and method may be made while retaining the teachings of the invention.

What is claimed is:

1. An overlapping trench gate semiconductor device, comprising:
    a semiconductor substrate, comprising a top surface and a bottom surface with the semiconductor substrate being a first conductive type;
    a plurality of shallow trenches, disposed on the top surface of the semiconductor substrate;
    a first conductive layer, disposed on the shallow trenches;
    a first insulation layer, disposed on surfaces of the shallow trenches, and electrically insulating the first conductive layer and the semiconductor substrate;
    a plurality of deep trenches, respectively disposed in each of the shallow trenches, extending into the semiconductor substrate under the shallow trenches;
    a second conductive layer, filling the deep trenches;
    a second insulation layer, disposed on the top surface of the semiconductor substrate and on surfaces of the deep trenches, and electrically insulating the second conductive layer from the semiconductor substrate and the first conductive layer;
    a source metal layer, disposed above the second insulation layer and the second conductive layer, and electrically connected to the second conductive layer;
    a gate metal layer, disposed on the second insulation layer and electrically connected to the first conductive layer; and
    a drain metal layer, disposed on the bottom surface of the semiconductor substrate.

2. The semiconductor device of claim 1, further comprising a protecting spacer, disposed between the first conductive layer and the second conductive layer, for adjusting a capacitance between the first conductive layer and the second conductive layer.

3. The semiconductor device of claim 1, further comprising a third insulation layer, disposed between the first conductive layer and the second insulation layer.

4. The semiconductor device of claim 1, further comprising:
    a plurality of doped base regions, having a second conductive type, and respectively disposed between any two adjacent shallow trenches;
    a plurality of doped source regions, having a first conductive type, respectively disposed above the doped base regions;
    a plurality of first source contact plugs, respectively disposed in each of the doped source regions and electrically connected to the source metal layer and each of the doped source regions; and
    a plurality of doped source contact regions, respectively disposed between each of the first source contact plugs and each of the base doped regions.

5. The semiconductor device of claim 4, wherein the first conductive type is an N type and the second conductive type is a P type.

6. The semiconductor device of claim 1, wherein the semiconductor substrate further comprises a substrate and an epitaxial layer, having the first conductive type, the epitaxial layer disposed on the substrate, and a dopant concentration of the substrate being higher than that of the epitaxial layer.

7. The semiconductor device of claim 1, further comprising a gate contact plug, being electrically connected to the first conductive layer and the gate metal layer.

8. The semiconductor device of claim 1, further comprising a fourth insulation layer and a plurality of second source contact plugs, with the fourth insulation layer being disposed between the second conductive layer and the source metal layer, and the second source contact plugs penetrating the fourth insulation layer and contacting the source metal layer and the second conductive layer.

* * * * *